(12) United States Patent
Lo et al.

(10) Patent No.: US 10,984,709 B2
(45) Date of Patent: Apr. 20, 2021

(54) DISPLAY PANEL

(71) Applicant: InnoLux Corporation, Miao-Li County (TW)

(72) Inventors: Min-Hsin Lo, Miao-Li County (TW); Kung-Chen Kuo, Miao-Li County (TW); Hung-Sheng Liao, Miao-Li County (TW); Yi-Hua Hsu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/382,506

(22) Filed: Apr. 12, 2019

(65) Prior Publication Data

US 2019/0333977 A1 Oct. 31, 2019

Related U.S. Application Data

(60) Provisional application No. 62/663,271, filed on Apr. 27, 2018.

(30) Foreign Application Priority Data

Oct. 12, 2018 (CN) .......................... 201811188143.4

(51) Int. Cl.
*G09G 3/3225* (2016.01)
*H01L 27/32* (2006.01)
(Continued)

(52) U.S. Cl.
CPC ......... *G09G 3/3225* (2013.01); *H01L 27/124* (2013.01); *H01L 27/1222* (2013.01);
(Continued)

(58) Field of Classification Search
CPC ......... G09G 3/3225; G09G 2310/0264; G09G 3/20; G09G 3/3266; G09G 2310/0291;
(Continued)

(56) References Cited

U.S. PATENT DOCUMENTS 4,775,809 A * 10/1988 Watanabe ........ H03K 19/00315
326/87
4,978,932 A * 12/1990 Gupta ....................... H01P 1/22
327/313
(Continued)

FOREIGN PATENT DOCUMENTS

CN 1410966 A 4/2003
CN 101487962 B 7/2012
(Continued)

OTHER PUBLICATIONS

European Search Report dated Jul. 3, 2019, issued in application No. EP 19171102.7.

*Primary Examiner* — Benyam Ketema
(74) *Attorney, Agent, or Firm* — McClure, Qualey & Rodack, LLP (57) ABSTRACT

A display panel has a display area and a peripheral area disposed adjacent to the display area. The display panel includes a pixel array, a plurality of gate lines, a plurality of first wirings, and a first gate driving circuit. The pixel array is disposed in the display area. The gate lines are coupled to the pixel array. The plurality of first wirings are coupled to the pixel array. The first gate driving circuit is disposed in the peripheral area and coupled to the pixel array via at least a portion of the plurality of first wirings and at least a portion of the plurality of gate lines. In the display area, the plurality of gate lines extend along a first direction and the plurality of first wirings extend along a second direction, and the first direction and the second direction are different.

19 Claims, 10 Drawing Sheets

(51) Int. Cl.
*H01L 27/12* (2006.01)
*G02F 1/1362* (2006.01)

(52) U.S. Cl.
CPC ............. *G02F 1/136286* (2013.01); *G09G 2310/0264* (2013.01)

(58) Field of Classification Search
CPC ... G09G 2310/0267; G09G 2300/0426; G09G 2300/0408; H01L 27/124; H01L 27/1222; G02F 1/136286
See application file for complete search history.

(56) References Cited

U.S. PATENT DOCUMENTS

| | | | | |
|---|---|---|---|---|
| 5,023,488 | A * | 6/1991 | Gunning | G06F 13/4072 |
| | | | | 326/30 |
| 5,081,374 | A * | 1/1992 | Davis | H03K 19/01721 |
| | | | | 326/27 |
| 5,754,480 | A * | 5/1998 | Sato | H03K 19/018571 |
| | | | | 365/189.05 |
| 5,808,595 | A * | 9/1998 | Kubota | G09G 3/3677 |
| | | | | 257/291 |
| 6,141,258 | A * | 10/2000 | Kawasumi | G11C 7/1051 |
| | | | | 327/538 |
| 6,166,570 | A * | 12/2000 | Hedberg | H04L 25/0276 |
| | | | | 326/26 |
| 6,292,014 | B1 * | 9/2001 | Hedberg | H04L 25/0286 |
| | | | | 326/21 |
| 7,567,231 | B2 | 7/2009 | Takahashi et al. | |
| 2003/0063080 | A1 * | 4/2003 | Takahashi | G02F 1/1345 |
| | | | | 345/211 |
| 2006/0007218 | A1 * | 1/2006 | Miyake | G09G 3/3258 |
| | | | | 345/204 |
| 2008/0036706 | A1 | 2/2008 | Kitazawa | |
| 2009/0121984 | A1 * | 5/2009 | Yamamoto | G09G 3/3266 |
| | | | | 345/76 |
| 2010/0033476 | A1 * | 2/2010 | Yamamoto | H01L 27/3262 |
| | | | | 345/214 |
| 2014/0043306 | A1 * | 2/2014 | Min | G09G 3/3685 |
| | | | | 345/204 |
| 2015/0021595 | A1 * | 1/2015 | In | H01L 27/1225 |
| | | | | 257/43 |
| 2016/0125844 | A1 | 5/2016 | Lee | |
| 2016/0358534 | A1 * | 12/2016 | Kim | G09G 3/20 |
| 2017/0213499 | A1 * | 7/2017 | Kong | G11C 19/28 |
| 2018/0364537 | A1 | 12/2018 | Huang et al. | |

FOREIGN PATENT DOCUMENTS

| | | |
|---|---|---|
| CN | 106023948 A | 10/2016 |
| WO | 2017/172375 A1 | 10/2017 |

* cited by examiner

DISPLAY PANEL

CROSS REFERENCE TO RELATED APPLICATIONS

This application claims the benefit of U.S. Provisional Application No. 62/663,271 filed Apr. 27, 2018 and entitled "GOP (Gate on Panel) or VSR (Vertical shift register) scan driving circuit design and location arrangement for narrow border or border free panel product", and further claims priority of China Patent Application No. 201811188143.4, filed on Oct. 12, 2018. The entirety of which are hereby incorporated by reference.

BACKGROUND

Field of the Disclosure

The disclosure relates to a display panel, and more particularly to a driving circuit for a narrow-border or a borderless display panel.

Description of the Related Art

Driving circuits are important elements of the display devices. Generally, driving circuits are disposed in the border area at two lateral sides of the substrate. However, this implementation occupies more space in the border area of the panel. Therefore, the width of the border area cannot be reduced, and it is unfavorable for designing a display panel having a narrow-border or extreme narrow-border, or even a borderless display panel.

In view of this, a novel design of a driving circuit suitable for a narrow-border, an extreme narrow-border or a borderless display panel or is capable of providing gate driving signals with similar driving capabilities for at least two gate lines is provided.

BRIEF SUMMARY OF THE DISCLOSURE

The disclosure relates to a display panel. An exemplary embodiment of a display panel has a display area and a peripheral area disposed adjacent to the display area. The display panel includes a pixel array, a plurality of gate lines, a plurality of first wirings, and a first gate driving circuit. The pixel array is disposed in the display area. The plurality of gate lines are coupled to the pixel array. The plurality of first wirings are coupled to the pixel array. The first gate driving circuit is disposed in the peripheral area and coupled to the pixel array via at least a portion of the plurality of first wirings and at least a portion of the plurality of the gate lines. In the display area, the gate lines extend along a first direction and the first wirings extend along a second direction, and the first direction and the second direction are different.

An exemplary embodiment of a display panel, having a display area and a peripheral area disposed adjacent to the display area, comprising a pixel array, a plurality of gate lines, a plurality of first wirings, and a first gate driving circuit. The pixel array is disposed in the display area. The plurality of gate lines are coupled to the pixel array. The plurality of first wirings are coupled to the pixel array. The first gate driving circuit is disposed in the peripheral area and coupled to the pixel array via at least a portion of the plurality of first wirings and the plurality of the gate lines. The first gate driving circuit comprises a first driving unit and a second driving unit. The first driving unit is coupled to one of the plurality of gate lines and comprises a first output buffer circuit with a first transistor. The second driving unit is coupled to one of the plurality of gate lines and comprises a second output buffer circuit with a second transistor. A size of the first transistor and a size of the second transistor are different.

A detailed description is given in the following embodiments with reference to the accompanying drawings.

BRIEF DESCRIPTION OF DRAWINGS

The disclosure can be more easily understood by reading the subsequent detailed description and examples with references made to the accompanying drawings, wherein.

DETAILED DESCRIPTION OF THE DISCLOSURE

The following description is of the contemplated mode of carrying out the disclosure. This description is made for the purpose of illustrating the general principles of the disclosure and should not be taken in a limiting sense. The scope of the disclosure is determined by reference to the appended claims.

In this disclosure, the technical features of the various embodiments may be replaced or combined with each other to complete other embodiments without being mutually exclusive.

In this disclosure, the term "Coupling/Coupled", unless otherwise defined, includes direct connection, indirect connection, electrical connection, and electrical coupling.

Use of ordinal terms such as "first", "second", etc., in the claims to modify a claim element does not by itself connote any priority, precedence, or order of one claim element over another or the temporal order in which acts of a method are performed, the ordinal terms are used merely as labels to distinguish one claim element having a certain name from another element having the same name (but for use of the ordinal term) to distinguish the claim elements.

Figure 1:
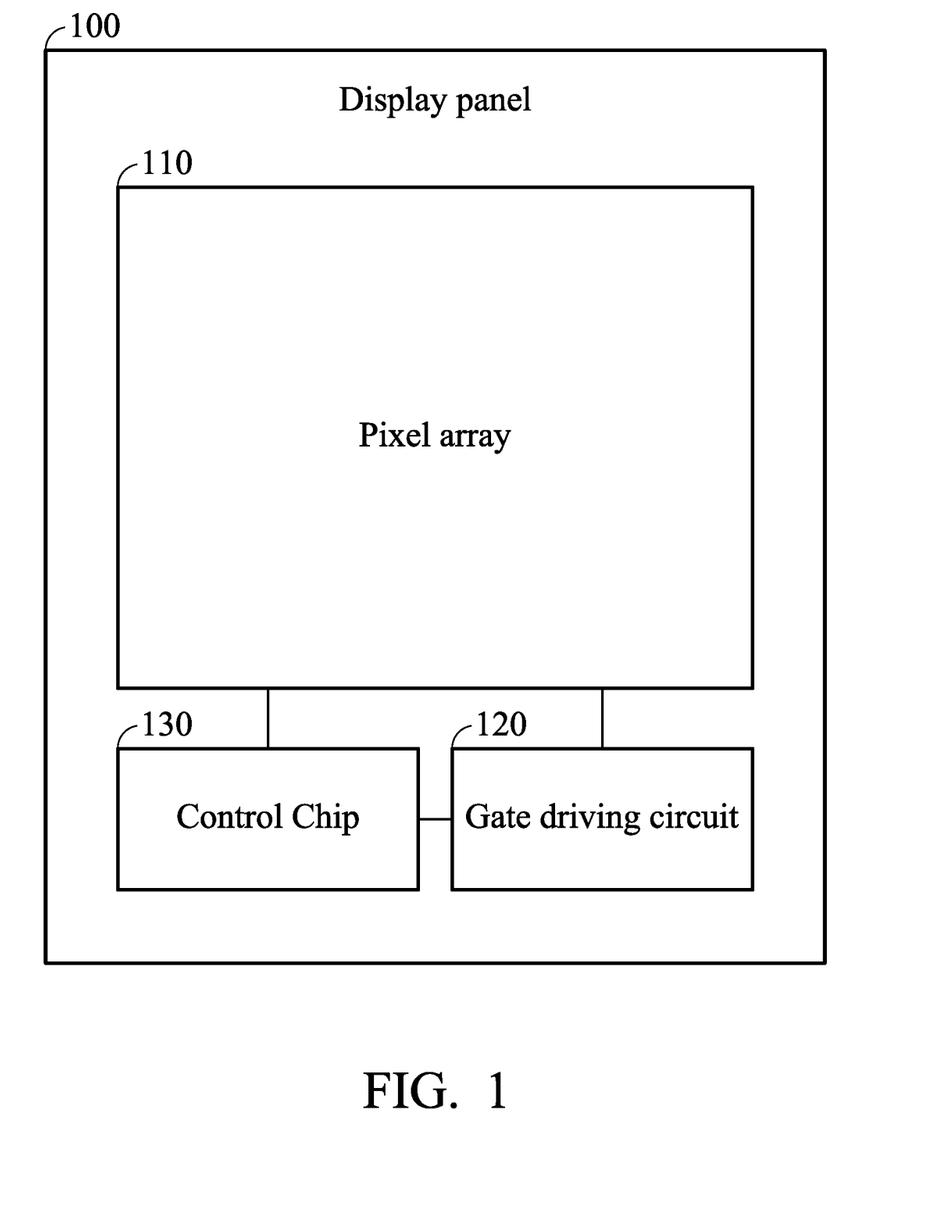
FIG. 1 shows an exemplary block diagram of a display panel according to an embodiment of the disclosure.

FIG. 1 shows an exemplary block diagram of a display panel according to an embodiment of the disclosure. As shown in FIG. 1, the display panel 100 may comprise a pixel array 110, a gate driving circuit 120 and a control chip 130. The pixel array 110 comprises a plurality of pixel units. One pixel unit comprises a corresponding pixel circuit. The gate driving circuit 120 is coupled to the gate lines and further coupled to the pixel array 110 via the gate lines, and configured to provide gate driving signals for driving the pixel units of the pixel array 110. The control chip 130 may be a chip integrating at least a data driving circuit and a timing controller circuit. The data driving circuit may be coupled to the pixel array 110 via a plurality of data lines and configured to provide data driving signals, and the image data is written to the pixel units in the pixel array 110 via the data driving signals. The timing controller circuit is configured to generate a plurality of timing signals, comprising clock signals, a reset signal, start pulses, an ending signal, etc.

It should be noted that the display panel 100 may be any type of display panel comprising an active matrix or a passive matrix, such as the Liquid Crystal Displays (LCD), the Organic light emitting diode (OLED) displays, the Micro-LED Displays, Mini-LED Displays, Quantum Dot LED Displays, or the Electronic Paper Display (EPD). In the disclosure, the display panel 100 may be a flexible, a stretchable or a rigid display panel. Generally, the display panel with the pixel circuit using one or more Thin-Film Transistors (TFTs) as the switches is called an active matrix display panel. When there is no transistor utilized in the pixel circuit as the switch, the display panel is called a passive display panel.

According to the embodiments of the disclosure, the display panel 100 may be applied in an electronic device. The electronic device may be implemented as various kinds of devices, comprising: a mobile phone, a digital camera, a lap-top computer, a personal computer, a television, an in-vehicle display, a portable DVD player, a splicing panel, a large outdoor display panel, or any apparatus with image display functionality.

In the disclosure, the area occupied by the pixel array 110 is the display area or the active area (AA) configured to display images of the display panel 100, and the area not occupied by the pixel array 110 is the peripheral area configured for disposing peripheral circuits of the display panel 100.

Recently, integrated gate driving circuit technology is developed that the gate driving circuit is formed on the panel. This technology is also called Gate driver On Panel (GOP). In the disclosure, a design of a GOP driving circuit is provided. The GOP driving circuit of this disclosure is suitable for a narrow-border, an extreme narrow-border or a borderless display panel and is capable of providing gate driving signals with similar driving capabilities for at least two gate lines.

Figure 2:
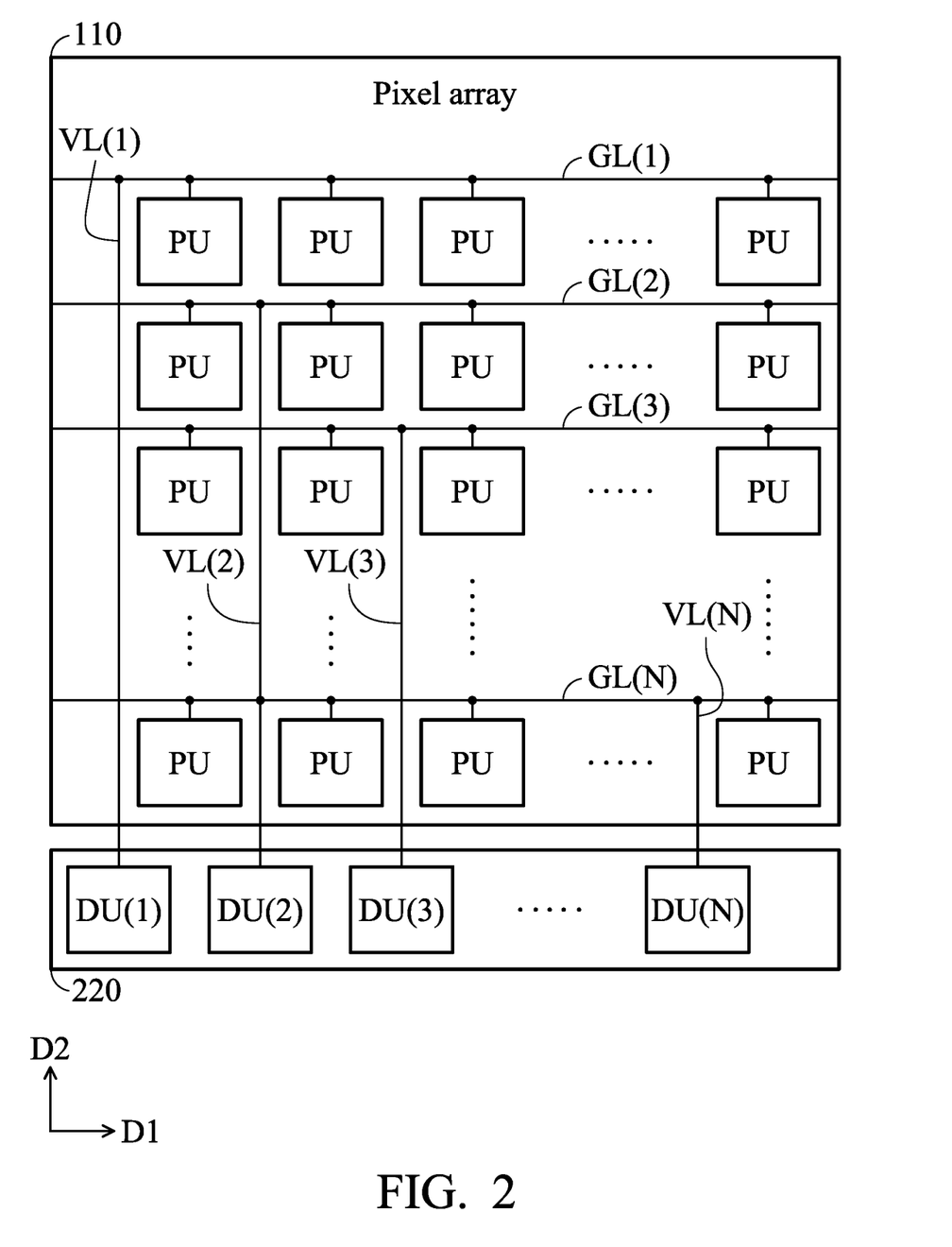
FIG. 2 is a schematic diagram of the driving circuit design according to an embodiment of the disclosure.

FIG. 2 is a schematic diagram of the driving circuit design according to an embodiment of the disclosure. According to an embodiment of the disclosure, the gate driving circuit 220 is disposed at the top or at the bottom of the display panel, where the top of the display panel may be the area above the first row pixel units (i.e., the first row of the pixel units that are turned on to receive the image data when displaying a frame), and the bottom of the display panel may be the area below the last row pixel units (i.e., the last row of the pixel units that are turned on to receive the image data when displaying a frame). In the embodiments of the disclosure, a row of pixel units are a group of pixel units arranged along the horizontal direction.

According to an embodiment of the disclosure, the gate driving circuit 220 may comprise a plurality of driving units DU(1), DU(2), DU(3) . . . DU(N), wherein N is a positive integer. One driving unit is coupled to a corresponding gate line, such as one of the gate lines GL(1), GL(2), GL(3) . . . GL(N). The driving units DU(1), DU(2), DU(3) . . . DU(N) sequentially output a corresponding gate driving signal to the corresponding gate lines GL(1), GL(2), GL(3) . . . GL(N). In addition, the gate driving signal output by one driving unit may be provided to an adjacent or following stage of the driving unit as an input signal thereof. For example, besides being provided to the gate line GL(1), the gate driving signal generated by the driving unit DU(1) is further provided to the driving unit DU(2) as the input signal thereof. Besides being provided to the gate line GL(2), the gate driving signal generated by the driving unit DU(2) is further provided to the driving unit DU(3) as the input signal thereof, and so on.

As shown in FIG. 2, in this example, the driving units DU(1), DU(2), DU(3) . . . DU(N) are disposed at the bottom of the display panel. The driving units are respectively coupled to the rows of pixel units which are coupled to the corresponding one of the gate lines GL(1), GL(2), GL(3) . . . GL(N) via the corresponding one of the first wirings VL(1), VL(2), VL(3) . . . VL(N), so as to provide the corresponding gate driving signal to the corresponding row of pixel units. For example, the driving unit DU(1) is coupled to the first row of pixel units via at least the first wiring VL(1) and the gate line GL(1). The driving unit DU(2) is coupled to the second row of pixel units via at least the first wiring VL(2) and the gate line GL(2), and so on.

According to an embodiment of the disclosure, the gate lines may be the wirings that substantially extend along a first direction D1, the first wirings may be the wirings substantially extend along a second direction D2. According to an embodiment of the disclosure, the first direction D1 and the second direction D2 are different. According to an embodiment of the disclosure, the first direction D1 is substantially perpendicular to the second direction D2.

It should be understood that configuration of the signal wirings shown in FIG. 2 is just one exemplary configuration of the gate driving circuit, and the disclosure should not be limited thereto.

Figure 3:
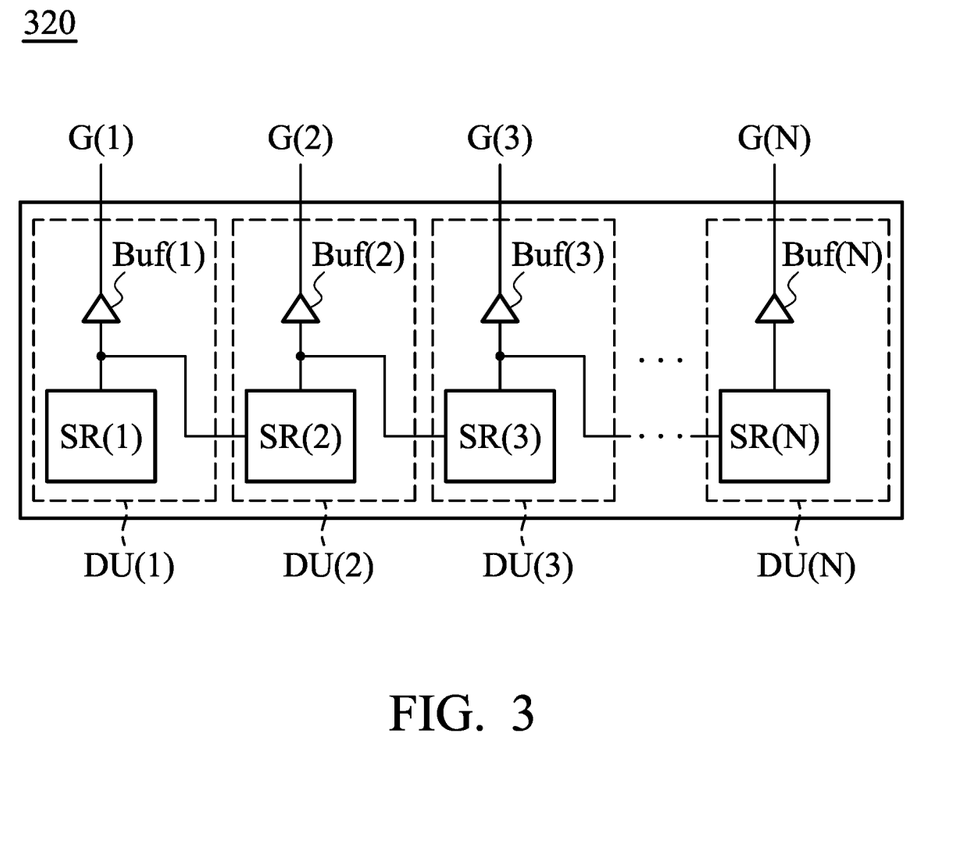
FIG. 3 is an exemplary block diagram of a gate driving circuit according to an embodiment of the disclosure.

FIG. 3 is an exemplary block diagram of a gate driving circuit according to an embodiment of the disclosure. The gate driving circuit 320 may comprise a plurality of driving units DU(1), DU(2), DU(3) . . . DU(N), wherein one driving unit may comprise a shift register, such as one of the shift registers SR(1), SR(2), SR(3) . . . SR(N), and a output buffer circuit, such as one of the buffer circuits Buf(1), Buf(2), Buf(3) . . . Buf(N). One of the shift registers SR(1), SR(2), SR(3) . . . SR(N) in the driving units is configured to generate the corresponding gate driving signal and provide the gate driving signal to the adjacent or following stage of the shift register as the corresponding input signal thereof. In addition, one of the buffer circuits Buf(1), Buf(2), Buf(3) . . . Buf(N) in the driving unit is configured to provide the corresponding gate driving signal, such that the output gate driving signals G(1), G(2), G(3) . . . G(N) can be transmitted along the corresponding wiring to the corresponding pixel units.

Figure 4A:
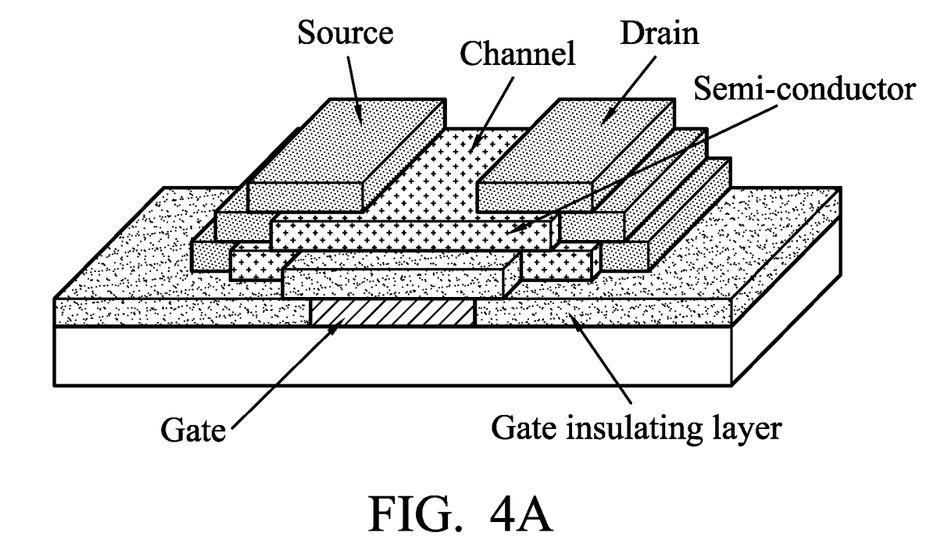
FIG. 4A and FIG. 4B are the diagrams to show the exemplary structure of a transistor according to an embodiment of the disclosure.
Figure 4B:
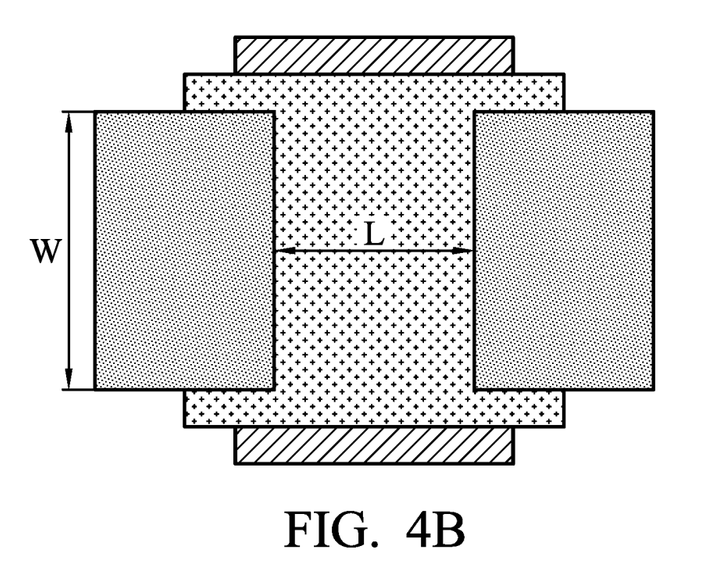

The output buffer circuit may comprise at least one transistor. In some embodiments of the disclosure, the transistor in the output buffer circuit may be a TFT (Thin film transistor), but the disclosure is not limited thereto. FIG. 4A and FIG. 4B are the diagrams show the exemplary structure of a transistor according to an embodiment of the disclosure. It should be understood that the structure of the transistor in the embodiments of the disclosure is not limited to the structure shown in FIG. 4A and FIG. 4B. According to an embodiment of the disclosure, the transistor in the output buffer circuit may comprise a channel region. The channel region has a width W and a pitch L. The size of the transistor is a ratio of the width W to the pitch L (W/L). In order to make the gate driving signals generated by the corresponding driving units to have similar driving capabilities when the gate driving signal arrive at the corresponding row of pixel units, at least two transistors in the gate driving circuit may be designed to have different sizes, and the size of the transistor may relate to the transmission distance of the gate driving signal output by the corresponding driving unit. For example, when the corresponding transistor size of a first driving unit is greater than that of a second driving unit, the transmission distance corresponding to the first driving unit is greater than that corresponding to the second driving unit of the gate driving circuit.

Figure 5A:
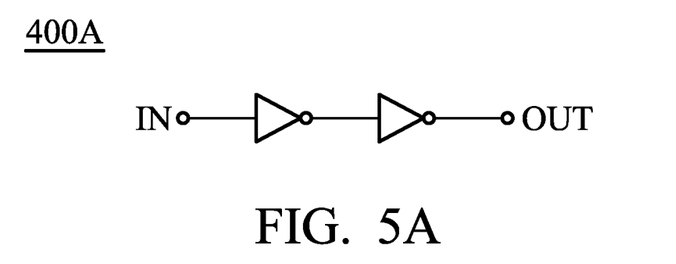
FIG. 5A is an exemplary circuit diagram of an output buffer circuit according to an embodiment of the disclosure.

FIG. 5A is an exemplary circuit diagram of an output buffer circuit according to an embodiment of the disclosure. The output buffer circuit 400A may comprise a plurality of inverters coupled in series between the input terminal IN and the output terminal OUT. The input terminal IN may be coupled to the output terminal of the corresponding shift register, and is configured to receive the corresponding gate driving signal. The output terminal OUT may be the output terminal of the corresponding driving unit, where the output terminal OUT may be coupled to a gate line via the corresponding first wiring, such that the gate driving signal output from the output terminal OUT can be provided to the corresponding pixel units via the corresponding first wiring.

According to an embodiment of the disclosure, the inverter may comprise one or more transistors.

Figure 5B:
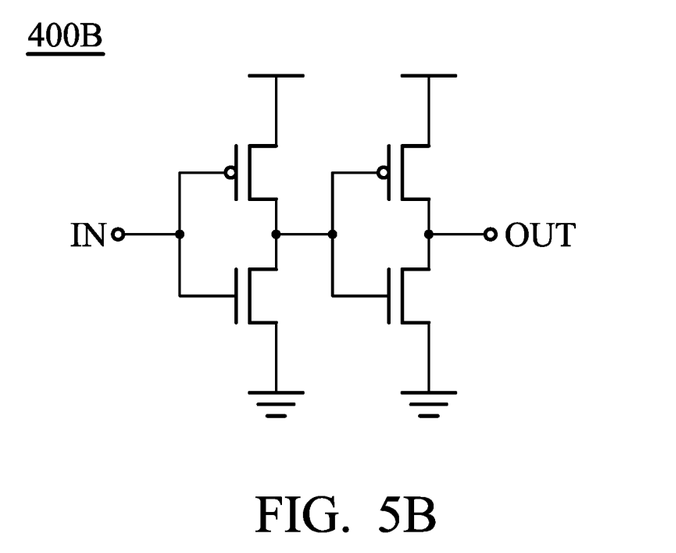
FIG. 5B is another exemplary circuit diagram of an output buffer circuit according to another embodiment of the disclosure.

FIG. 5B is another exemplary circuit diagram of an output buffer circuit according to another embodiment of the disclosure. The output buffer circuit 400B may comprise a plurality of inverters coupled in series between the input terminal IN and the output terminal OUT, wherein one of the inverters may comprise two transistors coupled in series between the power source and the ground. The inverter circuit shown in FIG. 5B may be implemented by the CMOS process. That is, the inverter may comprise a P-type MOS transistor (PMOS) and an N-type MOS transistor (NMOS) coupled in series. It should be noted that the disclosure is not limited to the CMOS process, and is not limited to the circuit structure, the number of inverters comprised in the output buffer circuit, the number of transistors comprised in the output buffer circuit and the coupling relationship thereof as shown in FIG. 5A and FIG. 5B, either.

Figure 6A:
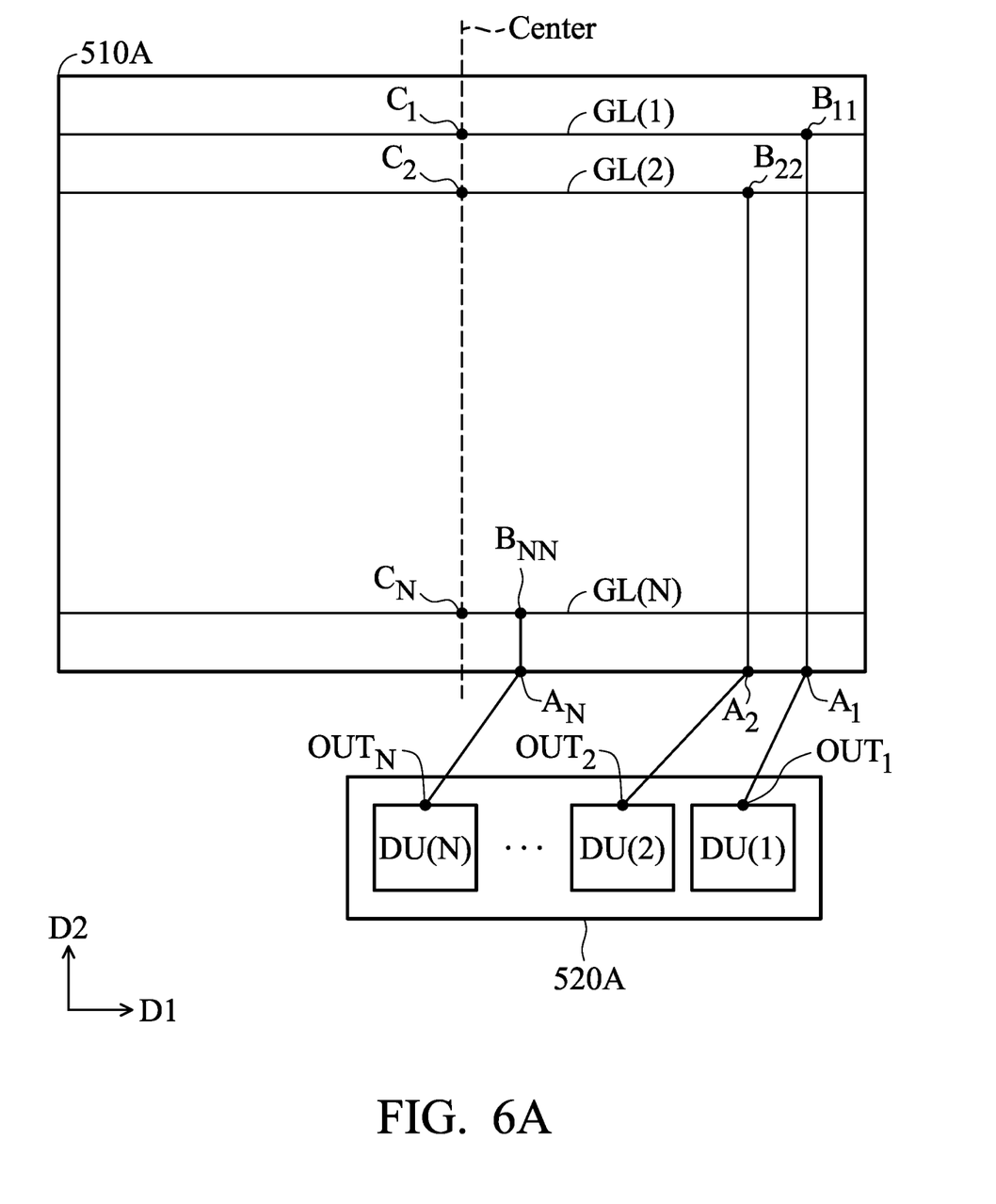
FIG. 6A is an exemplary configuration of the gate driving circuit and the corresponding wirings according to an embodiment of the disclosure.

FIG. 6A shows an exemplary configuration of the gate driving circuit and the corresponding wirings according to an embodiment of the disclosure. The gate driving circuit 520A may comprise a plurality of driving units DU(1), DU(2), DU(3) . . . DU(N). According to an embodiment of the disclosure, the first wirings may comprise the line section located in the peripheral area and extended from the output terminal of the output buffer circuit to the intersection of the first wiring and the edge of the pixel array, and the line section located in the display area and extended from the edge of the pixel array along the first wiring to a signal receiving point of the gate line corresponding to the driving unit. As shown in FIG. 6A, the line sections of the first wirings located in the display area are extended substantially along the second direction D2, and the line sections of the first wirings located in the peripheral area are extended substantially along the third direction D3, wherein the third direction D3 is different from the second direction D2, but the disclosure is not limited thereto. In other embodiments of the disclosure, the line sections of the first wirings located in the peripheral area may be extended along multiple directions, or may be designed to have an arc shape, and the disclosure is not limited to any specific way of implementation.

In the disclosure, the transmission distance of one driving unit may be a summation of the lengths of the paths that the gate driving signal is output from the output terminal of the corresponding output buffer circuit to the intersection of the corresponding gate line and a central line of the display area. As shown in FIG. 6A, according to an embodiment of the disclosure, the transmission path of the gate driving signal output by the driving unit DU(1) may comprise a line section from the output terminal $OUT_1$ of the corresponding output buffer circuit to a first intersection $A_1$ of the first wiring and the edge of the pixel array, a line section from the first intersection $A_1$ along the first wiring to the signal receiving point $B_{11}$ of the gate line GL(1), and a line section from the signal receiving point $B_{11}$ of the gate line GL(1) to an intersection $C_1$ of the gate line GL(1) and the central line Center of the display area. Therefore, the first transmission distance of the transmission path corresponding to the driving unit DU(1) may be a summation of the lengths of the line sections on the signal transmission path as ($\overline{OUT_1A_1}$+$\overline{A_1B_{11}}$+$\overline{B_{11}C_1}$).

Similarly, the transmission path of the gate driving signal output by the driving unit DU(2) may comprise a line section from the output terminal $OUT_2$ of the corresponding output buffer circuit to a second intersection $A_2$ of the first wiring and the edge of the pixel array, a line section from the second intersection $A_2$ along the first wiring to the signal receiving point $B_{22}$ of the gate line GL(2), and a line section from the signal receiving point $B_{22}$ of the gate line GL(2) to an intersection $C_2$ of the gate line GL(2) and the central line Center of the display area. Therefore, the second transmission distance of the transmission path corresponding to the driving unit DU(2) may be a summation of the lengths of the line sections on the signal transmission path as ($\overline{OUT_2A_2}$+$\overline{A_2B_{22}}$+$\overline{B_{22}C_2}$). Similarly, the transmission distance of the transmission path corresponding to the driving unit DU(N) may be a summation of the lengths of the line sections on the signal transmission path as ($\overline{OUT_NA_N}$+$\overline{A_NB_{NN}}$+$\overline{B_{NN}C_N}$), where $C_1$~$C_N$ may be the corresponding intersections of gate lines GL(1)~GL(N) and the central line Center of the display area.

As discussed above, the size of the transistor in the output buffer circuit of the driving unit may relate to the transmission distance of the gate driving signal output by the corresponding driving unit. According to an embodiment of the disclosure, when the first transmission distance ($\overline{OUT_1A_1}$+$\overline{A_1B_{11}}$+$\overline{B_{11}C_1}$) corresponding to the first driving unit is greater than the second transmission distance ($\overline{OUT_2A_2}$+$\overline{A_2B_{22}}$+$\overline{B_{22}C_2}$) corresponding to the second driving unit, the size of the corresponding transistor in the first driving unit may be designed to be greater than the size of the corresponding transistor in the second driving unit.

In addition, it should be noted that although the gate driving circuit 520A is disposed at the bottom of the display panel (i.e., adjacent to the area below the last row pixel units in the pixel array) in the embodiments illustrated above, the disclosure is not limited thereto.

Figure 6B:
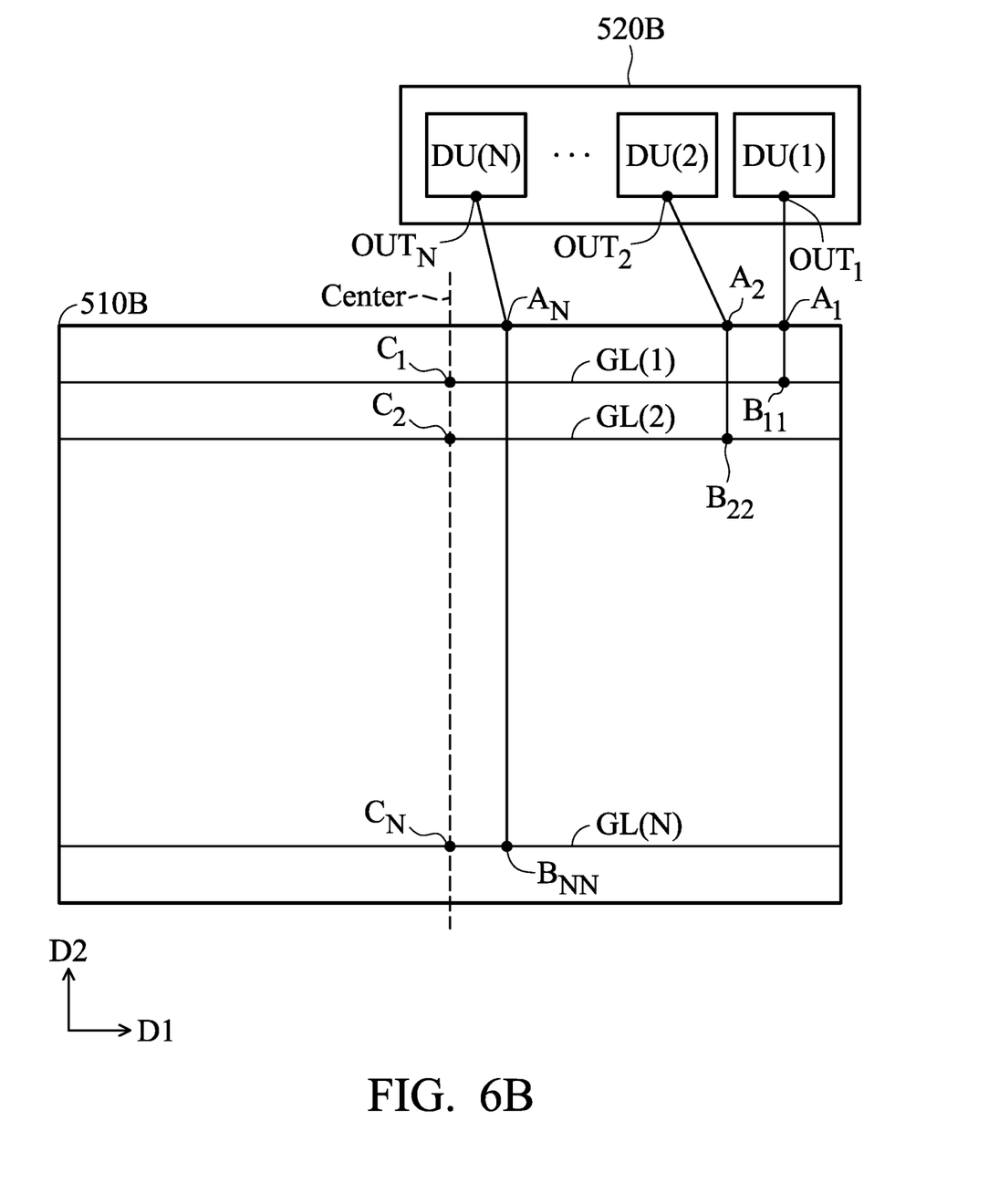
FIG. 6B is another exemplary configuration of the gate driving circuit and the corresponding wirings according to another embodiment of the disclosure.

FIG. 6B shows another exemplary configuration of the gate driving circuit and the corresponding wirings according to another embodiment of the disclosure. In this embodiment, the gate driving circuit 520B is disposed at the top (i.e., adjacent to the area above the first row pixel units in the pixel array) of the display panel. Similarly, in this embodiment, the transmission path of the gate driving signal output by the driving unit DU(X) may comprise a line section from the output terminal of the corresponding output buffer circuit to an intersection of the corresponding first wiring and the edge of the pixel array, a line section from the intersection along the corresponding first wiring to the signal receiving point of the corresponding gate line, and a line section from the signal receiving point of the corresponding gate line to an intersection of the corresponding gate line and the central line Center of the display area. Therefore, the transmission distance of the signal transmission path corresponding to the driving unit DU(X) may be a summation of the lengths of the line sections on the signal transmission path as ($\overline{A_X B_{XX}} + \overline{B_{XX} C_X} + \overline{OUT_X A_X}$), where 1≤X≤N, and N is a positive integer.

In addition, it should be noted that although in the embodiments as illustrated above, a unilateral gate driving circuit is disposed at the top or at the bottom of the display panel, the disclosure should not be limited thereto.

Figure 7A:
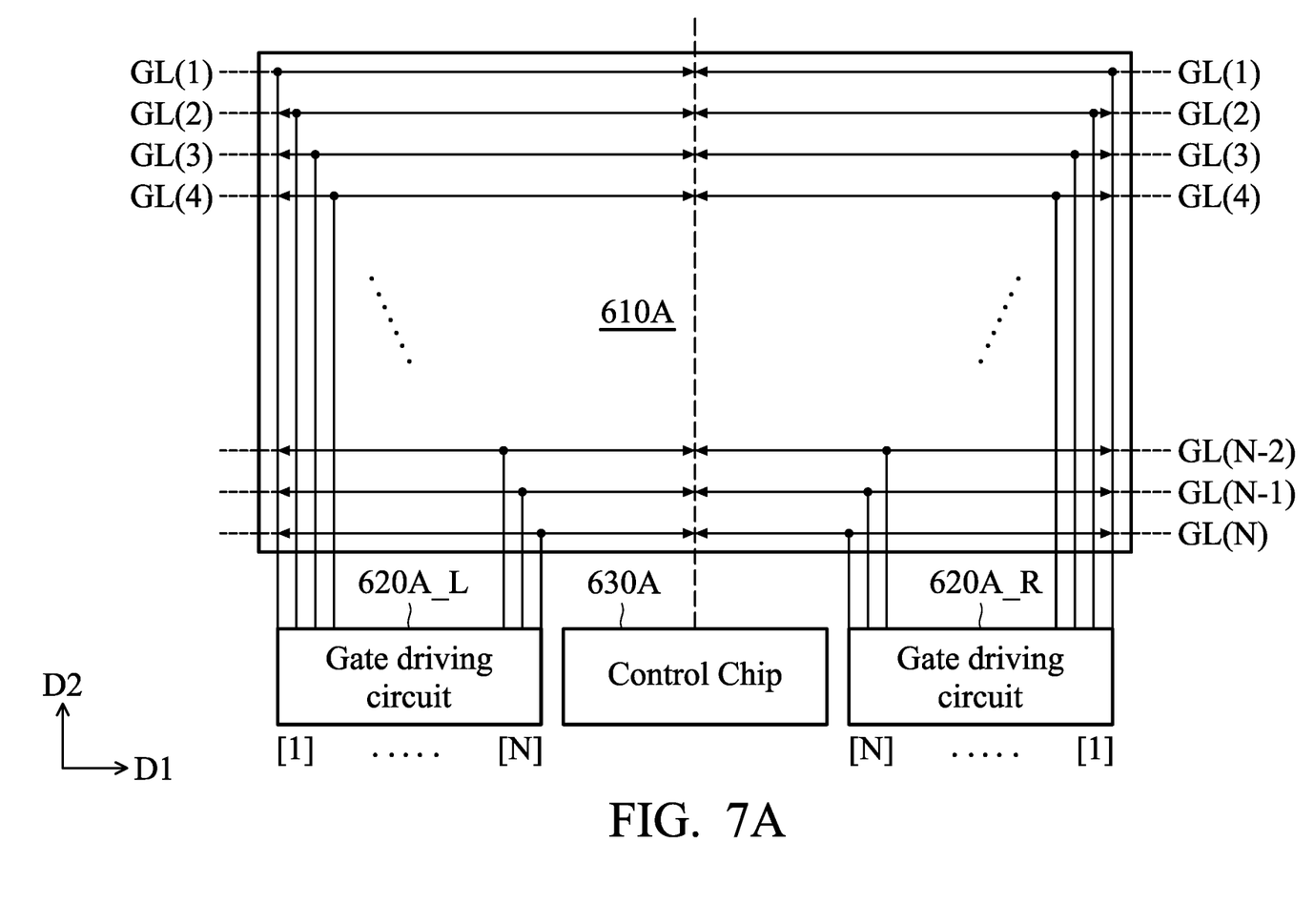
FIG. 7A is another exemplary configuration of the gate driving circuit of the display panel according to an embodiment of the disclosure.

FIG. 7A shows another exemplary configuration of the gate driving circuit of the display panel according to an embodiment of the disclosure. In this embodiment, gate driving circuits 620A_L and 620A_R and the control chip 630A are disposed at the bottom of the pixel array 610A, and the gate driving circuits 620A_L and 620A_R are disposed near two sides of the control chip 630A. The stages of the driving units in the gate driving circuits 620A_L and 620A_R are respectively coupled to the corresponding gate lines GL(1), GL(2), GL(3), GL(4) . . . GL(N−2), GL(N−1) and GL(N) for implementing bilateral gate driving. In this embodiment, similarly, for different driving units in the gate driving circuits 620A_L and 620A_R, the sizes of the transistors comprised in the corresponding output buffer circuit may be different. For example, the gate driving circuit 620A_L may comprise a first driving unit (not shown) and a second driving unit (not shown). The first driving unit comprises a first output buffer circuit (not shown) for providing a first gate driving signal and the second driving unit comprises a second output buffer circuit (not shown) for providing a second gate driving signal. The transistor in the first output buffer circuit and the transistor in the second output buffer circuit may have different sizes. Similarly, the gate driving circuit 620A_R may comprise a third driving unit (not shown) and a fourth driving unit (not shown). The third driving unit comprises a third output buffer circuit (not shown) for providing a third gate driving signal and the fourth driving unit comprises a fourth output buffer circuit (not shown) for providing a fourth gate driving signal. The transistor in the third output buffer circuit and the transistor in the fourth output buffer circuit may have different sizes.

The transistor size of the output buffer circuits in the driving units of the gate driving circuits 620A_L and 620A_R may relate to the transmission distance of the corresponding driving units. For example, when the size of the transistor in the first driving unit of the gate driving circuit is greater than that the size of the transistor in the second driving unit, the first transmission distance corresponding to the first driving unit may be greater than the second transmission distance corresponding to the second driving unit. The transmission distance corresponding to one driving unit is the summation of the lengths of the signal transmission paths that the gate driving signal is output from the output terminal of the corresponding output buffer circuit of the driving unit to the intersection of the gate line corresponding to the driving unit and a central line of the display area.

Figure 7B:
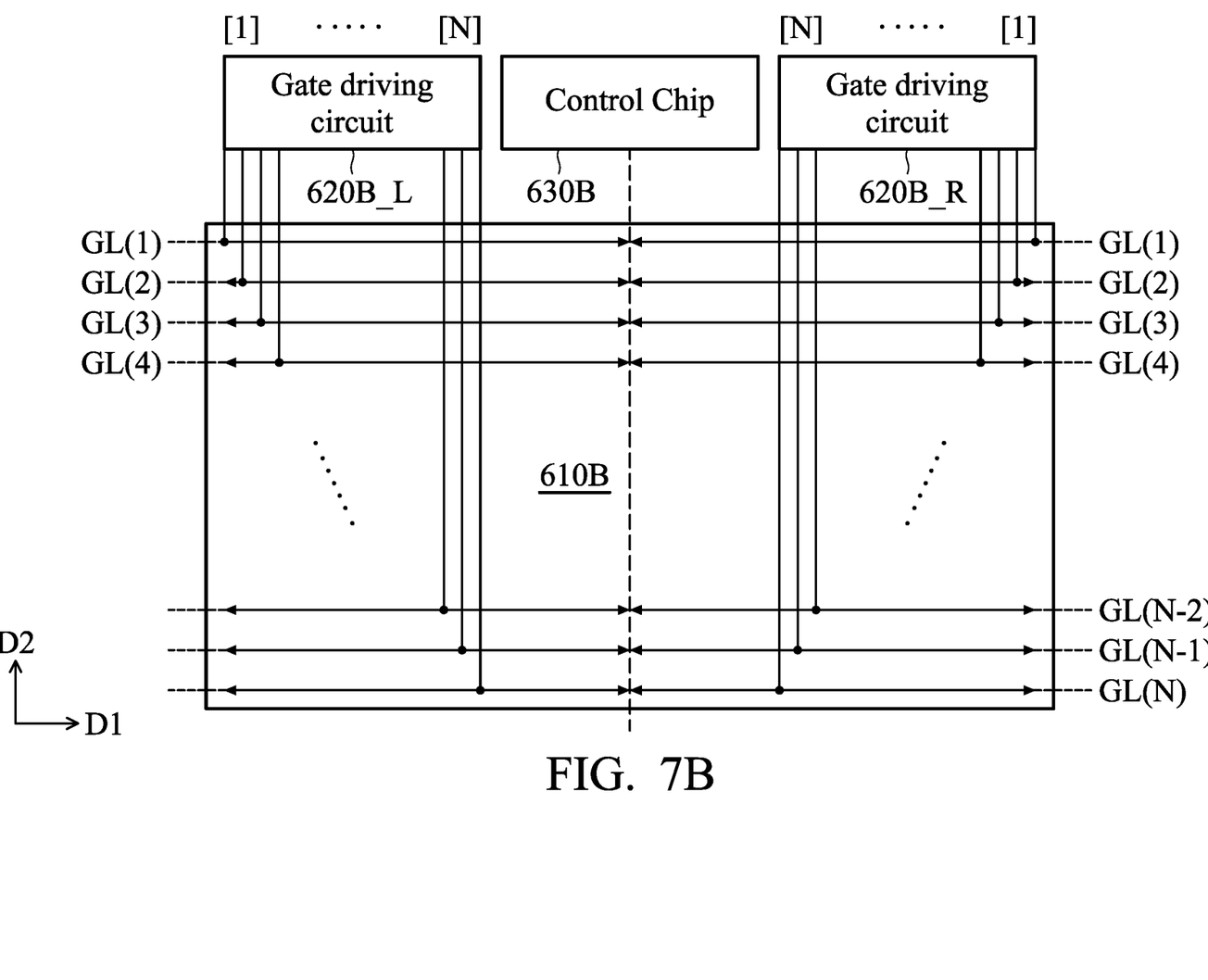
FIG. 7B is another exemplary configuration of the gate driving circuit of the display panel according to another embodiment of the disclosure.

FIG. 7B shows another exemplary configuration of the gate driving circuit of the display panel according to another embodiment of the disclosure. In this embodiment, gate driving circuits 620B_L and 620B_R and the control chip 630B are disposed at the top of the display panel, and the gate driving circuits 620B_L and 620B_R are disposed at two lateral sides of the control chip 630B. One stage of the driving units in the gate driving circuits 620B_L and 620B_R is coupled to the corresponding one of the gate lines GL(1), GL(2), GL(3), GL(4) . . . GL(N−2), GL(N−1) and GL(N) for implementing bilateral gate driving. In this embodiment, the transistor size of the output buffer circuits in different driving units of the gate driving circuits 620B_L and 620B_R may relate to the transmission distance of the corresponding driving units. For example, when the size of the transistor in the first driving unit of the gate driving circuit is greater than that the size of the transistor in the second driving unit, the first transmission distance corresponding to the first driving unit may be greater than the second transmission distance corresponding to the second driving unit. The transmission distance corresponding to one driving unit is the summation of the lengths of the signal transmission paths that the gate driving signal is output from the output terminal of the corresponding output buffer circuit to the intersection of the gate line corresponding to the driving unit and a central line of the display area.

Figure 7C:
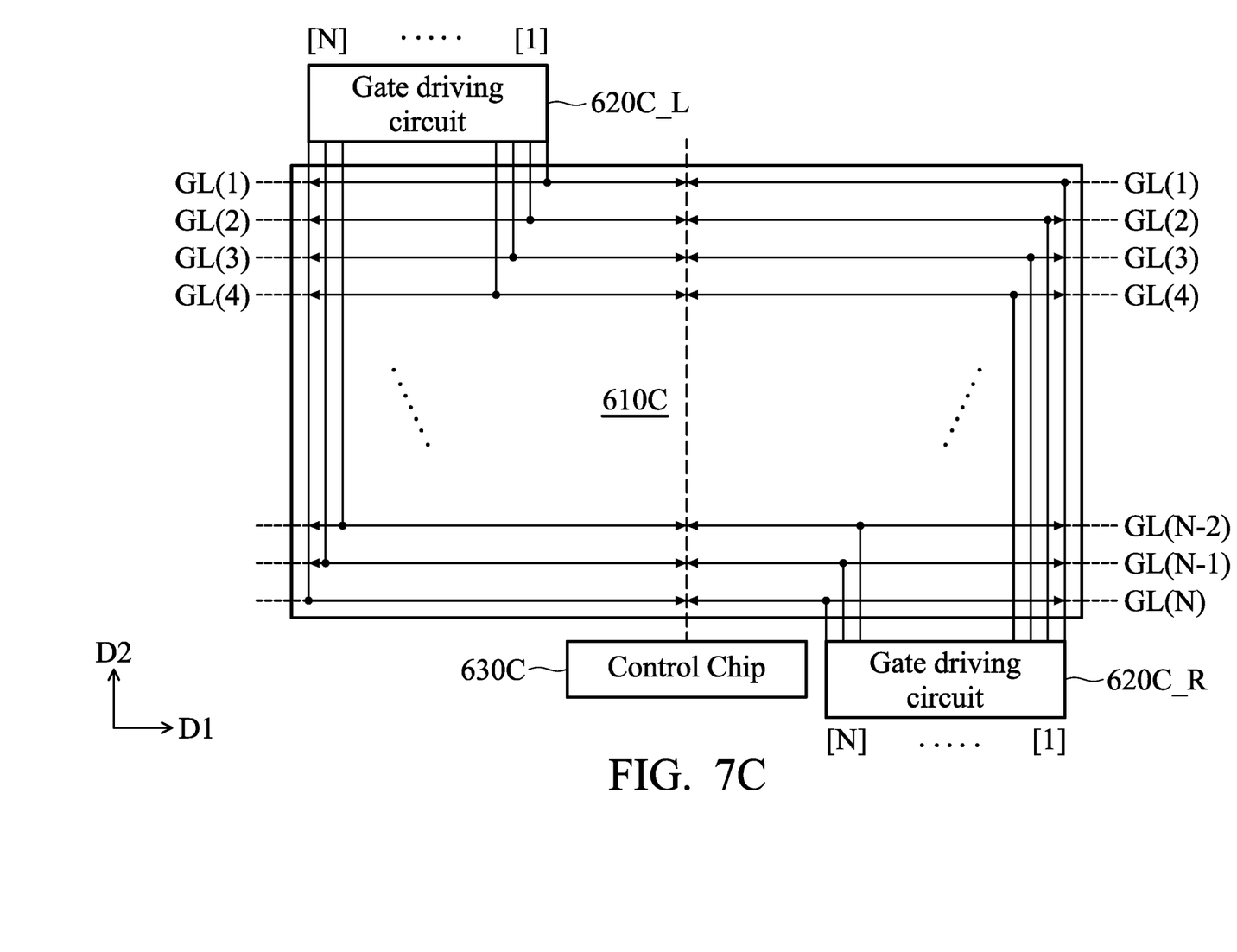
FIG. 7C is another exemplary configuration of the gate driving circuit of the display panel according to another embodiment of the disclosure.

FIG. 7C shows another exemplary configuration of the gate driving circuit of the display panel according to another embodiment of the disclosure. In this embodiment, gate driving circuit 620C_L is disposed at the top of the display panel, the gate driving circuit 620C_R and the control chip 630C are disposed at the bottom of the display panel, and the gate driving circuits 620C_L and 620C_R are disposed at two sides of the central line of the pixel array 610C. One stage of the driving units in the gate driving circuits 620C_L and 620C_R is respectively coupled to the corresponding one of the gate lines GL(1), GL(2), GL(3), GL(4) . . . GL(N−2), GL(N−1) and GL(N) for implementing bilateral gate driving. In this embodiment, similarly, for different driving units in the gate driving circuits 620C_L and 620C_R, the size of the transistors comprised in the corresponding output buffer circuit may be different. For example, the transistor size of the output buffer circuits in the driving units of the gate driving circuits 620C_L and 620C_R may relate to the transmission distance of the corresponding driving units. The transmission distance corresponding to one driving unit is the summation of the lengths of the signal transmission paths that the gate driving signal is output from the output terminal of the corresponding output buffer circuit to the intersection of the gate line corresponding to the driving unit and a central line of the display area.

According to an embodiment of the disclosure, the gate driving circuits 620C_L and 620C_R may respectively comprise a plurality of driving units. At least one driving unit of the gate driving circuit is coupled to one of the gate lines via one of the first wirings, and further coupled to a row of pixel units arranged in the horizontal direction in the pixel array via the corresponding one of the gate lines.

In the disclosure, by disposing the gate driving circuit at the top or at the bottom of the display panel (that is, the region above or below the pixel array), the space occupation problem occurred in the conventional design when the driving circuits are disposed in the border area at two lateral sides of the display panel can be solved. In addition, in the embodiments of the disclosure, the output buffer circuits in the gate driving circuit(s) may be configured to have the transistors with different sizes, such that the gate driving signals can have similar driving capabilities when arriving the corresponding row of pixel units through different transmission paths with different transmission distances. For example, when the size of the transistor in the first driving unit of the gate driving circuit is greater than that the size of the transistor in the second driving unit, the first transmission distance corresponding to the first driving unit may be greater than the second transmission distance corresponding to the second driving unit. Via the novel designs as illustrated above, the gate driving circuit can be suitable for a narrow-border, an extreme narrow-border or a borderless display panel and is capable of providing gate driving signals with similar driving capabilities for at least two gate lines.

While the disclosure has been described by way of example and in terms of preferred embodiment, it is to be understood that the disclosure is not limited thereto. Those who are skilled in this technology can still make various alterations and modifications without departing from the scope and spirit of this disclosure. Therefore, the scope of the present disclosure shall be defined and protected by the following claims and their equivalents.

What is claimed is:

1. A display panel, having a display area and a peripheral area disposed adjacent to the display area, comprising:
   a pixel array, disposed in the display area;
   a plurality of gate lines, coupled to the pixel array;
   a plurality of first wirings, coupled to the pixel array; and
   a first gate driving circuit, disposed in the peripheral area and coupled to the pixel array via at least a portion of the plurality of first wirings and at least a portion of the plurality of gate lines,
   wherein in the display area, the plurality of gate lines extend along a first direction and the plurality of first wirings extend along a second direction, and the first direction and the second direction are different,
   wherein the first gate driving circuit comprises a first driving unit and a second driving unit, the first driving unit comprises a first output buffer circuit with a first transistor, the second driving unit comprises a second output buffer circuit with a second transistor, and a size of a channel region of the first transistor is greater than a size of a channel region of the second transistor,
   wherein the size of the channel region of the first transistor relates to a first transmission distance which is a summation of the lengths of the paths that a first gate driving signal is output from an output terminal of the first output buffer circuit to an intersection of a corresponding gate line and a central line of the display area, and the size of the channel region of the second transistor relates to a second transmission distance which is a summation of the lengths of the paths that a second gate driving signal is output from an output terminal of the second output buffer circuit to an intersection of a corresponding gate line and the central line of the display area.

2. The display panel as claimed in claim 1, wherein in the peripheral area, one of the plurality of first wirings extends along a third direction, and the third direction and the second direction are different.

3. The display panel as claimed in claim 1, wherein one of the plurality of first wirings corresponding to the first driving unit has a first length, one of the plurality of first wirings corresponding to the second driving unit has a second length, and the first length is greater than the second length.

4. The display panel as claimed in claim 1, wherein the first transmission distance is greater than the second transmission distance.

5. The display panel as claimed in claim 1, wherein the first driving unit further comprises a shift register coupled to the first output buffer circuit.

6. The display panel as claimed in claim 1, wherein the first output buffer circuit comprises an inverter, and the inverter comprises the first transistor.

7. The display panel as claimed in claim 1, further comprising a control chip disposed in the peripheral area, and wherein the first gate driving circuit is disposed adjacent to the control chip.

8. The display panel as claimed in claim 7, further comprising a second gate driving circuit disposed in the peripheral area, wherein the control chip is disposed between the first gate driving circuit and the second gate driving circuit.

9. The display panel as claimed in claim 8, wherein one of the plurality of gate lines is coupled to the first gate driving circuit or the second gate driving circuit.

10. A display panel, having a display area and a peripheral area disposed adjacent to the display area, comprising:
    a pixel array, disposed in the display area;
    a plurality of gate lines, coupled to the pixel array;
    a plurality of first wirings, coupled to the pixel array; and
    a first gate driving circuit, disposed in the peripheral area and coupled to the pixel array via at least a portion of the plurality of first wirings and at least a portion of the plurality of gate lines, the first gate driving circuit comprising a first driving unit and a second driving unit,
    wherein the first driving unit is coupled to one of the plurality of gate lines and comprises a first output buffer circuit with a first transistor, the second driving unit is coupled to one of the plurality of gate lines and comprises a second output buffer circuit with a second transistor, and a size of a channel region of the first transistor and a size of a channel region of the second transistor are different, wherein the size of the channel region of the first transistor relates to a first transmission distance which is a summation of the lengths of the paths that a first gate driving signal is output from an output terminal of the first output buffer circuit to an intersection of a corresponding gate line and a central line of the display area, and the size of the channel region of the second transistor relates to a second transmission distance which is a summation of the lengths of the paths that a second gate driving signal is output from an output terminal of the second output buffer circuit to an intersection of a corresponding gate line and the central line of the display area.

11. The display panel as claimed in claim 10, wherein in the display area, the plurality of gate lines extend along a first direction and the plurality of first wirings extend along a second direction, and the first direction and the second direction are different.

12. The display panel as claimed in claim 10, wherein in the peripheral area, one of the plurality of first wirings extends along a third direction, and the third direction and the second direction are different.

13. The display panel as claimed in claim 10, wherein one of the plurality of first wirings corresponding to the first driving unit has a first length, one of the plurality of first wirings corresponding to the second driving unit has a second length, and the first length is greater than the second length.

14. The display panel as claimed in claim 10, wherein the first transmission distance and the second transmission distance are different.

15. The display panel as claimed in claim 14, wherein the first transmission distance is greater than the second transmission distance.

16. The display panel as claimed in claim 15, wherein the size of the channel region of the first transistor is greater than the size of the channel region of the second transistor.

17. The display panel as claimed in claim 10, further comprising a second gate driving circuit disposed in the peripheral area.

18. The display panel as claimed in claim 17, further comprising a control chip disposed in the peripheral area, and wherein the control chip is disposed between the first gate driving circuit and the second gate driving circuit.

19. The display panel as claimed in claim 17, wherein one of the plurality of gate lines is coupled to the first gate driving circuit or the second gate driving circuit.

* * * * *